(12) United States Patent
Liang

(10) Patent No.: US 6,894,570 B2
(45) Date of Patent: May 17, 2005

(54) FAST FREQUENCY LOCKING METHOD AND ARCHITECTURE REALIZED BY EMPLOYING ADAPTIVE ASYMMETRIC CHARGE-PUMP CURRENT MECHANISM

(75) Inventor: Fong-Lieh Liang, TaiChung (TW)

(73) Assignee: Holtek Semiconductor Inc., Hsinchu (TW)

( * ) Notice: Subject to any disclaimer, the term of this patent is extended or adjusted under 35 U.S.C. 154(b) by 100 days.

(21) Appl. No.: 10/639,502

(22) Filed: Aug. 13, 2003

(65) Prior Publication Data

US 2004/0189402 A1 Sep. 30, 2004

(30) Foreign Application Priority Data

Mar. 28, 2003 (TW) ........................................ 92107024 A

(51) Int. Cl.[7] ................................................ H03L 7/10

(52) U.S. Cl. ............................ 331/17; 331/8; 331/10; 331/16; 331/25; 327/157

(58) Field of Search .............................. 331/1 A, 4, 8, 331/10–12, 14, 16–18, 25, DIG. 2; 327/156–159; 332/127; 360/51; 375/376; 455/260

(56) References Cited

U.S. PATENT DOCUMENTS 5,220,294 A * 6/1993 Ichikawa ...................... 331/17

* cited by examiner

Primary Examiner—David Mis
(74) Attorney, Agent, or Firm—Troxell Law Office, PLLC

(57) ABSTRACT

The present invention is related to a fast frequency locking method and architecture realized by employing adaptive asymmetric charge-pump current mechanism, whose circuit is composed of elements such as: a pair of frequency-dependent main current sources, a pair of (rising, descending) frequency-dependent assistant current sources, a digital control circuit, a voltage controlled oscillator, an impedance, a sampling frequency sampled from output frequency of the voltage controlled oscillator, a fixed reference frequency and a phase detector, etc. The difference between the present invention and traditional charge-pump circuit is that the present invention had added at least one pair of frequency-dependent assistant current sources. The frequency-dependent assistant current sources are used to enlarge current source so that frequencies predefined by user can be achieved promptly by employing the voltage controlled oscillator to control the rising or descending of voltage under different power voltages, and then a digital control circuit of the present invention can be utilized to achieve the objective of fast frequency locking.

8 Claims, 5 Drawing Sheets

FAST FREQUENCY LOCKING METHOD AND ARCHITECTURE REALIZED BY EMPLOYING ADAPTIVE ASYMMETRIC CHARGE-PUMP CURRENT MECHANISM

BACKGROUND OF THE INVENTION

1. Field of the Invention

The present invention is related to a fast frequency locking method and architecture realized by employing adaptive asymmetric charge-pump current mechanism, especially to a method which can enable fast locking of circuit frequency, furthermore to a method that applying an existing current source within a charge-pump to charge/discharge filters of circuit and simultaneously applying an assistant current source at a side of the existing current source to provide a large output current while frequency change, so that frequency locking can be achieved within a shorter period of time.

2. Description of the Prior Arts

Nowadays, accompanying the improvement of circuit design and manufacture technique, processing speed of electronic circuit increases as well. Therefore, a phase-locked circuit with fast locking function and has a short locking and recovery period is needed. While designing the fast locking phase-locked circuit, a dilemma of fast locking and low noise must be considered. That is, when frequency locking process of phase-locked loop becomes faster, its filter's bandwidth is increased such that noises generated within circuit are also increased relatively; on the other hand, if bandwidth of filter is narrowed to reduce noise so as to solve the above drawback, then processing speed of phase-locked loop becomes comparatively slow accordingly.

Please refer to FIG. 1, a traditional charge-pump circuit is illustrated whose circuit is composed of elements such as: a pair of frequency-dependent main current sources, a voltage controlled oscillator, an impedance, a sampling frequency, a fixed frequency and a phase detector, etc. Wherein, a charging current source is provided and is equal to discharging current source, so as to enable control voltage of voltage controlled oscillator (VCO) to provide an efficient discharging conduit while control voltage is too high and output frequency is too fast. In this way, control voltage can be decreased and frequency can be reduced. Hence, during a frequency locking process of the whole circuit, a transient state of locking process is generated that the frequency will oscillate for a period of time till a stable value is reached. This is the operating principle of traditional charge-pump circuit of the prior arts. Assuming the range of frequency change is unknown, to achieve a best frequency locking state, charging current and discharging current shall be equal in size so that frequency won't rise too fast and descend too slow. However, in this traditional frequency locking structure, some leakage current is still being generated within circuit during frequency locking process. The leakage current also generates interference noises toward the circuit that consequently causes prolong of frequency locking process. The present invention can overcome this drawback of the prior arts.

SUMMARY OF THE INVENTION

Based on solving the above-mentioned drawbacks of the prior arts, the present invention is a fast frequency locking method and architecture realized by employing adaptive asymmetric charge-pump current mechanism. The main objective of the present invention is applying a digital frequency rising and lowing feedback circuit and a current source set including a fixed current source and a set of assistant current sources whose values are changed according to the high/low of frequency to reduce the time needed for frequency locking, which under the situation that the components of the original integrated circuit do not increase dramatically; the assistant current source is composed of a upward-filled assistant current source and a downward-filled assistant current source.

For your esteemed members of reviewing committee to further understand and recognize the objectives, the characteristics, and the functions of the invention, a detailed description in matching with corresponding drawings are presented as the following.

DETAILED DESCRIPTION OF THE INVENTION

Figure 1:
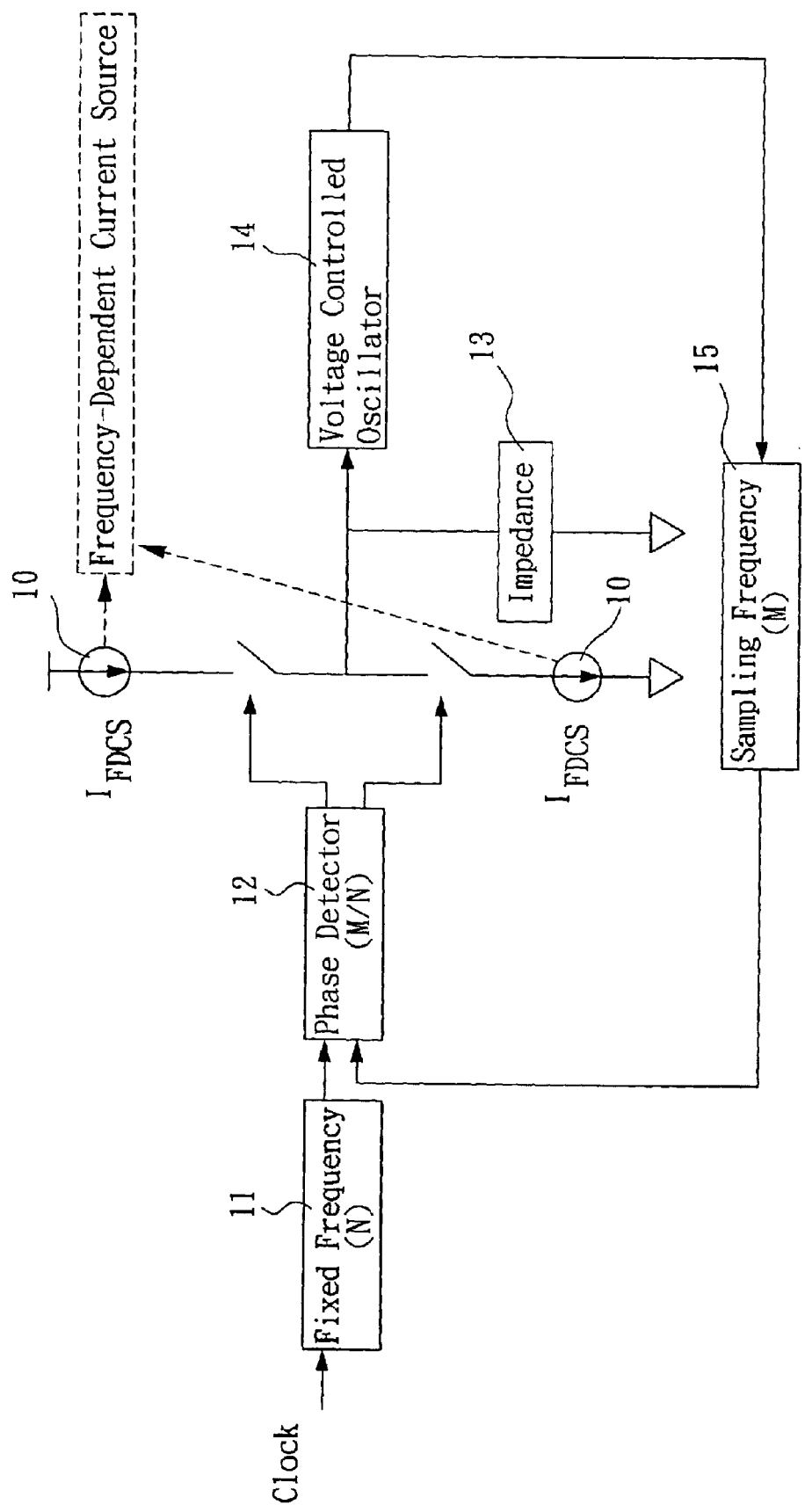
FIG. 1 is an architecture drawing of charge-pump circuit according to the prior arts.
Figure 2:
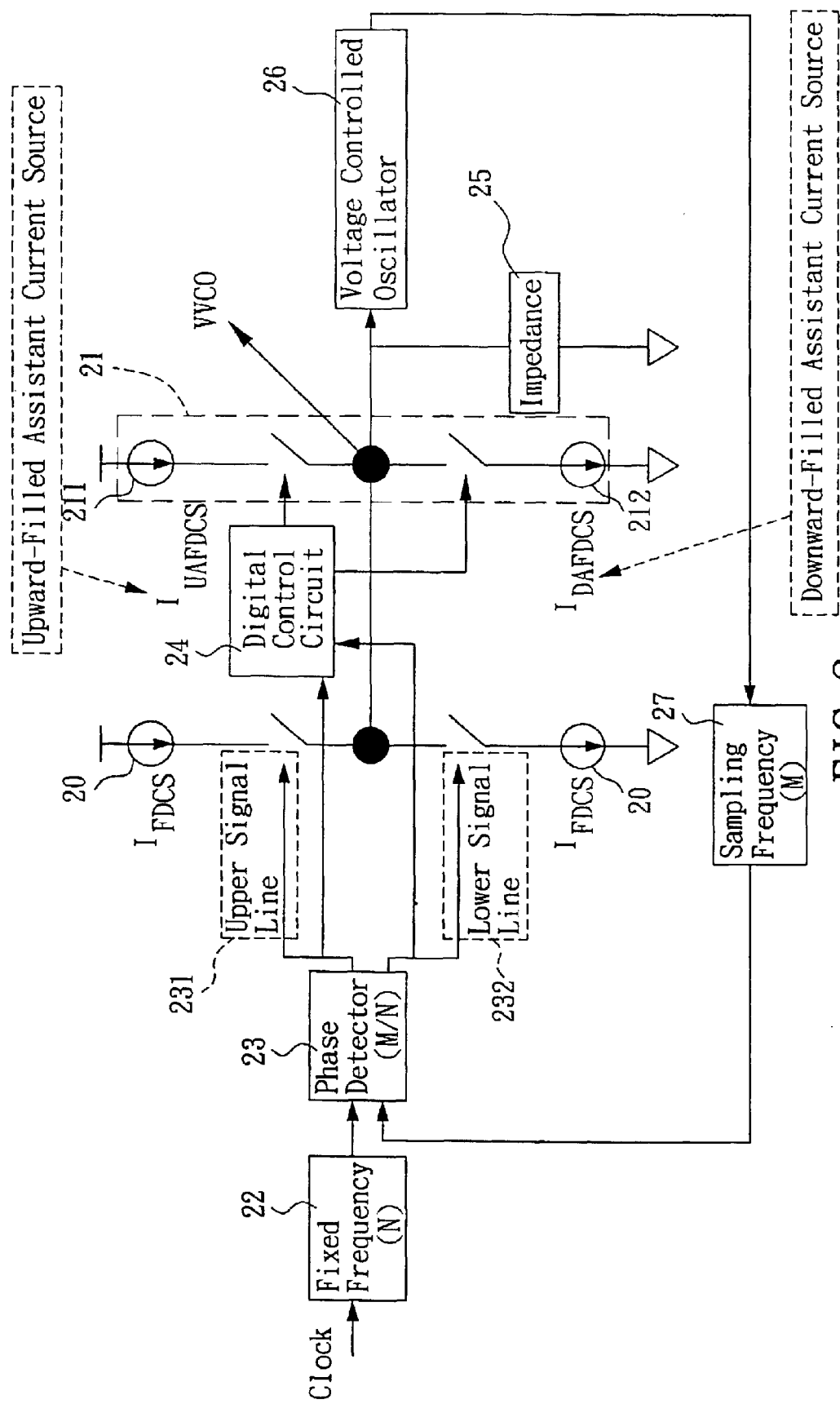
FIG. 2 is an architecture drawing of charge-pump circuit according to the present invention.

Please refer to FIG. 2, a charge-pump architecture drawing of the present invention is illustrated depicting a circuit composes of elements such as: a pair of frequency-dependent main current sources 20, a pair of (rising, descending) frequency-dependent assistant current sources 21 (including a upward-filled assistant current sources 211 and a downward-filled assistant current sources 212), a digital control circuit 24, a voltage controlled oscillator 26, an impedance 25, a sampling frequency 27, a fixed frequency 22 and a phase detector 23, etc. The difference between the present invention and traditional charge-pump circuit is that the present invention had added at least one pair of frequency-dependent assistant current sources 21 (in the present embodiment, one set is added). The frequency-dependent assistant current sources 21 are used to enlarge current (normally, it is several times or even tenfolds of main current source) so that frequencies predefined by user can be achieved promptly, and then digital control circuit 24 of the present invention can be utilized to achieve the objective of fast frequency locking. The architecture of the present invention includes:

A voltage controlled oscillator 26, which is used to generate an AC signal whose frequency is proportional to voltage value of its input control signal;

A main current source 20, whereof is a pair of frequency-dependent main current sources;

An assistant current source 21, the current provided by the assistant current source 21 is at least larger than the main current source 20;

An impedance 25, whose value is designed according to the volume of current source.

A digital control circuit 24, which is used to evaluate input frequency and circuit enabling, moreover it can control actions of frequency locking; and A phase detector 23, which can focus on comparing fixed frequency 22 and a sampling frequency 27 to acquire a comparison value, and then the comparison value is delivered to a digital control circuit as parameter value of action.

Figure 3:
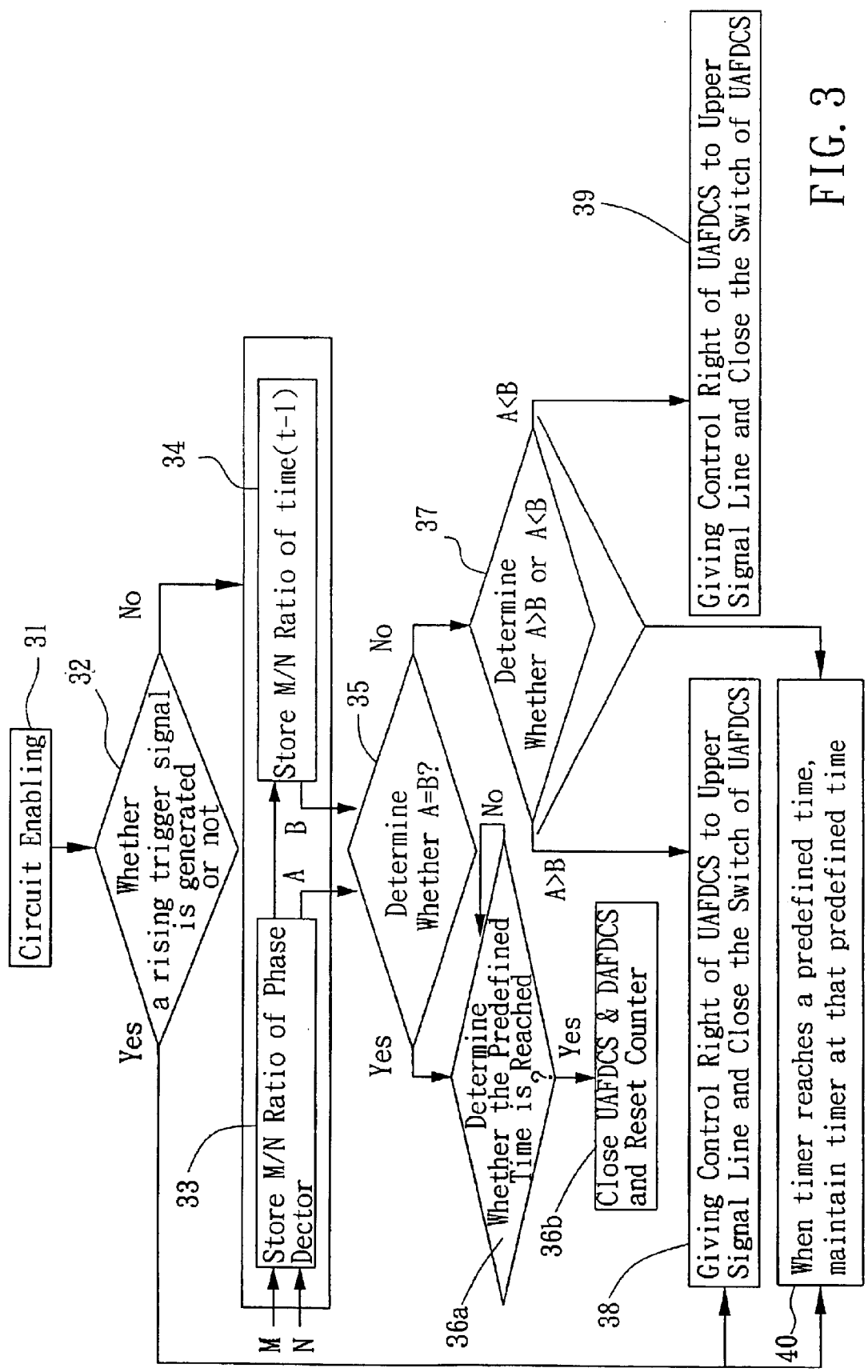
FIG. 3 is a controlling flowchart of digital control circuit according to the present invention

Please refer to FIG. 2 and FIG. 3 simultaneously, a controlling flowchart of digital control circuit according to the present invention is illustrated with reference to FIG. 3, wherein a digital control circuit 24 controls both rising and descending assistant current source 21 so that, no matter it is during circuit activation or switch between frequencies, a predefined frequency value is rapidly locked according to the current needed for frequency change after the frequency change had been evaluated. Moreover, while reaching the predefined frequency, assistant current source 21 is closed to achieve frequency stability. The digital control circuit 24 includes the following processing steps:

31~circuit enabling;

32~determining whether a rising trigger signal can be generated or not;

33~storing M/N ratio of phase detector;

34~storing M/N ratio of time (t-1);

35~determining whether A=B; If yes, then execute step 36; otherwise, execute step 37;

36~determining whether predefined time is reached; if not, then repeat the comparison until reaching the predefined time; if yes, then turn off upward-filled and downward-filled assistant current source (UAFDCS & DAFDCS) and reset counter;

37~determining whether A>B or A<B; if A>B, then execute step 38; if A<B, then execute step 39;

38~giving control right of UAFDCS to upper signal line, and close the switch of UAFDCS;

39~giving control right of UAFDCS to lower signal line, and close the switch of UAFDCS;

40~maintaining timer at that predefined time when timer reaches a predefined time.

By means of the above steps, the processing procedures of the digital control circuit is depicting respectively as following:

(1) After clock is being transmitted continuously to circuits, under the condition that a comparison value obtained by comparing fixed frequency (N) 22 and sampling frequency (M) 27 is a constant value, then circuits' state is transformed from shutdown to enable. When enable signal is detected by digital control circuit 24 and consequently decides that frequency is risen starting from 0, therefore, digital control circuit 24 passes control right of UAFDCS 211 to upper signal line 231 and closes the switch (Turn on) of UAFDCS 211 while frequency starts locking rapidly; After UAFDCS 211 had worked for a predefined time, digital control circuit 24 will open the switch (Turn off) of UAFDCS 211 and consequently makes frequency more stable.

(2) At the time that frequency is stabilized and provided that the frequency is F1, a new frequency F2 is preferred and F2>F1, then fixed frequency (N) 22 and sampling frequency (M) 27 must be changed so that sampling frequency (F2)/ fixed frequency (F2) is larger than sampling frequency (F1)/fixed frequency (F1). Digital control signal 24 determines whether frequency has already risen using a comparison value obtained by comparing fixed frequency (N) 22 and sampling frequency (M) 27, and consequently digital control circuit 24 passes control right of UAFDCS 211 to upper signal line 231 and closes the switch (Turn on) of UAFDCS 211 while frequency starts locking rapidly; After UAFDCS 211 had worked for a predefined time, digital control circuit 24 will open the switch (Turn off) of UAFDCS 211 and consequently makes frequency more stable.

(3) At the time that frequency is stabilized and provided that the frequency is F1, a new frequency F3 is preferred and F1>F3, then fixed frequency (N) 22 and sampling frequency (M) 27 must be changed so that sampling frequency (F3)/ fixed frequency (F3) is smaller than sampling frequency (F1)/fixed frequency (F1). Digital control signal 24 determines whether frequency has already fallen using a comparison value obtained by comparing fixed frequency (N) 22 and sampling frequency (M) 27, and consequently digital control circuit 24 passes control right of UAFDCS 211 to lower signal line 232 and closes the switch (Turn on) of UAFDCS 211 while frequency starts locking rapidly; After UAFDCS 211 had worked for a predefined time, digital control circuit 24 will open the switch (Turn off) of UAFDCS 211 and consequently makes frequency more stable.

Figure 4:
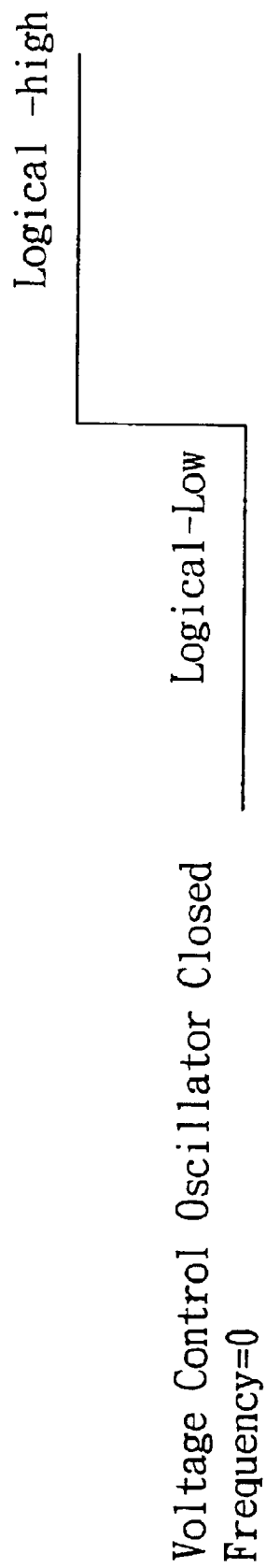
FIG. 4 is a state schematic drawing illustrating the state of clock control signal is transferred from zero to enable signal.
Figure 5:
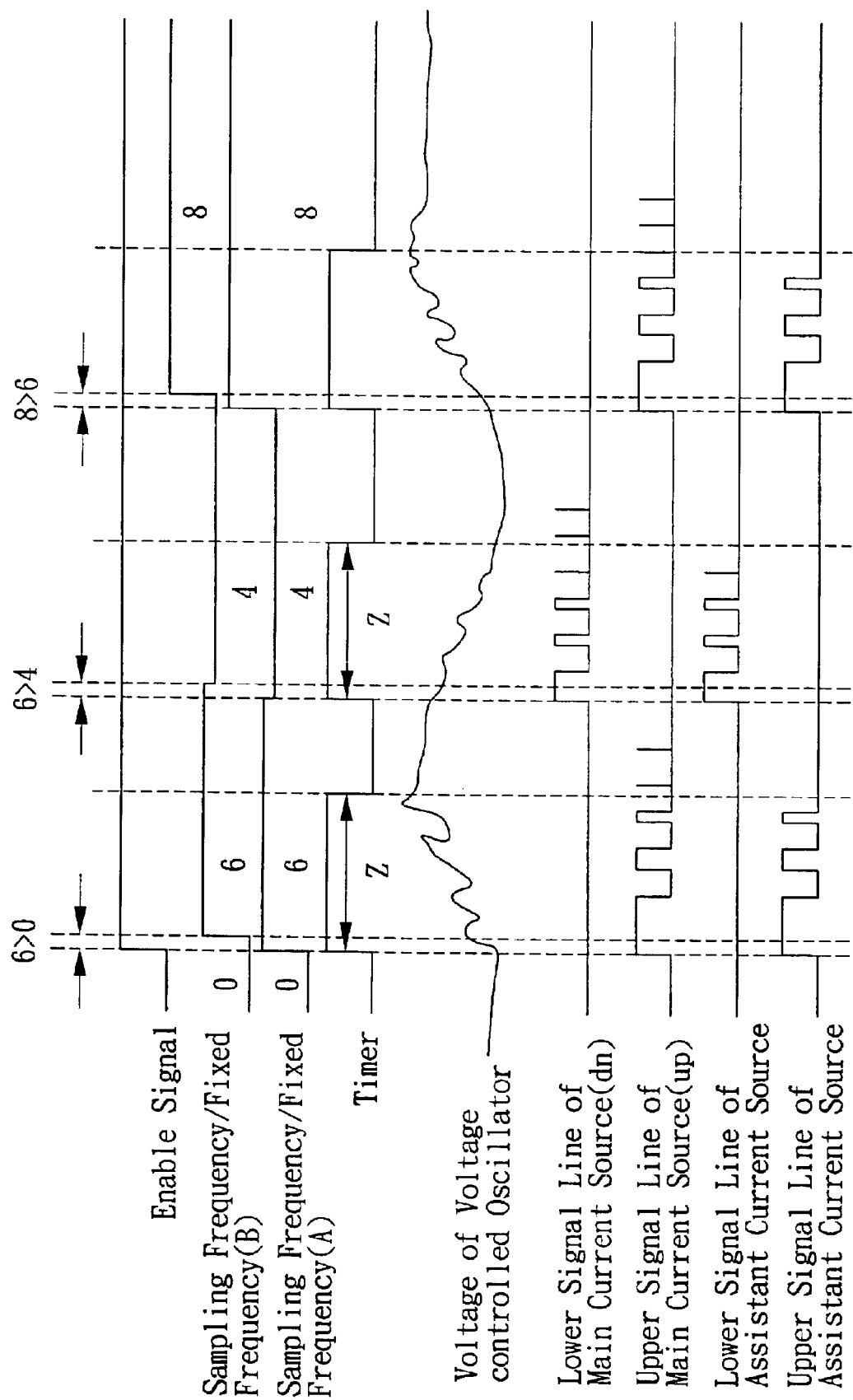
FIG. 5 is a relation diagram depicting actions and clock control variation of main current source and assistant current source.

Please refer to FIG. 4 and FIG. 5, a state schematic drawing is illustrated depicting the state of clock control signal is transferred from zero to enable signal, and a relation diagram is illustrated depicting actions and clock control variation of main current source and assistant current source. With reference to FIG. 4 and FIG. 5, circuit triggers a signal at logical-high, whereof during a predefined time of timer and by a dual action of main current source and assistant current source, which enables frequency to rise or descend rapidly to the neighborhood of predefined frequency, and then by using digital control circuit to control UAFDCS to achieve the objective of fast locking of predefined frequency.

In summary that this invention has been disclosed and illustrated with reference to particular embodiments, the principles involved are susceptible for use in numerous other embodiments that will be apparent to persons skilled in the art. Consequently, the present invention has been examined to be progressive and has great potential in commercial applications.

Those skilled in the art should appreciate that they can readily use the disclosed conception and specific embodiments as a basis for designing or modifying other structures for carrying out the same purpose of the present invention, and that various changes, substitutions and alterations can be made herein without departing from the spirit and scope of the invention as defined by the append claims.

What is claimed is:

1. A fast frequency locking architecture realized by employing adaptive asymmetric charge-pump current mechanism, comprising:

a voltage controlled oscillator, which is used to generate an AC signal;

a main current source, which is a pair of frequency-dependent main current sources;

at least an assistant current source, wherein currents provided by said assistant current source shall be at least larger than said main current source;

an impedance, whose value is designed according to the volume of said main and assistant current source;

a digital control circuit, which is used to evaluate an input frequency and circuit enabling, moreover, for controlling a frequency locking operation; and a phase detector, which compares a fixed frequency and a sampling frequency to acquire a comparison value, and then said comparison value is transferred to a digital control circuit as a parameter.

2. The fast frequency locking architecture as recited in claim 1, wherein a ratio relation function between a fixed frequency and a sampling frequency of said phase detector is:

(said sampling frequency)/(said fixed frequency)

by which said parameter of said digital control circuit is acquired.

3. The fast frequency locking architecture as recited in claim 1, wherein said phase detector further comprising an upper signal line and a lower signal line for controlling rising and descending of frequency.

4. The fast frequency locking architecture as recited in claim 1, wherein said assistant current source comprising an upward-filled assistant current source and a downward-filled assistant current source.

5. The fast frequency locking architecture as recited in claim 1, wherein volume of said assistant current source is ranging from several times to tenfold said main current source.

6. A method for a fast frequency locking method realized by employing adaptive asymmetric charge-pump current mechanism, wherein a digital control circuit includes the following steps:

(a)~circuit enabling;

(b)~determining whether a rising trigger signal is generated or not;

(c)~storing M/N ratio of phase detector;

(d)~storing M/N ratio of time (t-1);

(e)~determining whether A=B;

(f)~determining whether a predefined time is reached; if not, then repeat the comparison until reaching the predefined time; if yes, then turn off upward-filled and downward-filled assistant current source (UAFDCS & DAFDCS) and reset counter;

(g)~determining whether A>B or A<B;

(h)~giving control right of UAFDCS to an upper signal line, and close the switch of UAFDCS;

(i)~giving control right of UAFDCS to lower signal line, and close the switch of UAFDCS; and (j)~maintaining timer at that predefined time when timer reaches a predefined time.

7. The method as recited in claim 6, wherein evaluating execution result of said step (e), if equal, then execute step (f); otherwise, execute step (g).

8. The method as recited in claim 6 wherein evaluating execution result of said step (g), if equal, then execute step (h); otherwise, execute step (i).

* * * * *